(12) United States Patent
Son et al.

(10) Patent No.: US 7,923,393 B2
(45) Date of Patent: *Apr. 12, 2011

(54) LOW MELTING POINT FRIT PASTE COMPOSITION AND SEALING METHOD FOR ELECTRIC ELEMENT USING THE SAME

(75) Inventors: Jung-Hyun Son, Hwaseong (KR); Sang-Kyu Lee, Hwaseong (KR); Han-Bok Joo, Hwaseong (KR)

(73) Assignee: DONGJIN SEMICHEM Co., Ltd., Gajwa-Dong, Seo-Gu, Incheon (KR)

( * ) Notice: Subject to any disclaimer, the term of this patent is extended or adjusted under 35 U.S.C. 154(b) by 181 days.

This patent is subject to a terminal disclaimer.

(21) Appl. No.: 12/271,252

(22) Filed: Nov. 14, 2008

(65) Prior Publication Data

US 2009/0136766 A1 May 28, 2009

(30) Foreign Application Priority Data

Nov. 26, 2007 (KR) .......................... 10-2007-0120924

(51) Int. Cl.
| | |
|---|---|
| *C03C 8/08* | (2006.01) |
| *C03C 8/14* | (2006.01) |
| *C03C 8/16* | (2006.01) |
| *C03C 8/24* | (2006.01) |
| *C03C 3/21* | (2006.01) |
| *C03B 23/00* | (2006.01) |
| *B29C 65/16* | (2006.01) |
| *H01J 9/26* | (2006.01) |

(52) U.S. Cl. ............... 501/24; 501/15; 501/17; 501/20; 501/46; 501/47; 156/275.5; 65/36; 65/43; 65/58; 445/44; 313/504

(58) Field of Classification Search .................... 501/15, 501/17, 20, 24, 46, 47; 156/89.11, 275.3, 156/275.5, 275.7; 65/36, 43, 58; 445/23, 445/25, 44; 313/504, 506, 512, 498
See application file for complete search history.

(56) References Cited

U.S. PATENT DOCUMENTS

| | | | |
|---|---|---|---|
| 3,885,975 A * | 5/1975 | Malmendier et al. ............ 501/41 |
| 5,346,863 A * | 9/1994 | Hikata et al. ..................... 501/17 |
| 2007/0090759 A1 * | 4/2007 | Choi et al. ....................... 313/512 |
| 2007/0170846 A1 * | 7/2007 | Choi et al. ....................... 313/504 |
| 2007/0194710 A1 * | 8/2007 | Song et al. ....................... 313/512 |
| 2009/0064717 A1 * | 3/2009 | Son et al. ........................... 65/42 |
| 2009/0065049 A1 * | 3/2009 | Son et al. ........................ 136/256 |
| 2009/0068917 A1 * | 3/2009 | Kim .................................. 445/25 |

* cited by examiner

*Primary Examiner* — Karl E Group
*Assistant Examiner* — Elizabeth A Bolden
(74) *Attorney, Agent, or Firm* — Lexyoume IP Group, PLLC.

(57) ABSTRACT

The present invention relates to a low melting point frit paste composition and a sealing method for an electric element using the same, and more particularly, to a low melting point frit paste composition which is sealable and appropriate for a flat panel, protects an element weak to heat and improves a process yield with good print properties, and a sealing method for an electric element using the same.

11 Claims, 7 Drawing Sheets

LOW MELTING POINT FRIT PASTE COMPOSITION AND SEALING METHOD FOR ELECTRIC ELEMENT USING THE SAME

CROSS-REFERENCE TO RELATED APPLICATION

This application claims priority from Korean Patent Application No. 2007-0120924, filed on Nov. 26, 2007 in the Korean Intellectual Property Office, the disclosure of which is incorporated herein by reference.

BACKGROUND OF THE INVENTION

1. Field of the Invention

The present invention relates to a low melting point frit paste composition, and more particularly, to a low melting point frit paste composition which is sealable and appropriate for manufacturing a flat panel, protects an element weak to heat and improves a process yield with good print properties, and a sealing method for an electric element using the same.

2. Description of the Related Art

There have been considerable studies about OLEDs in recent years as they can potentially apply to various arear and electroluminescent devices. For example, an OLED can be used in manufacturing a panel thinner than existing display panels. Also, the OLED provides good process availability and has drawn attention as a next generation display with process appropriateness of a flexible display as a next generation display. The OLED display has good contrast and a wide viewing angle, high brightness and low driving voltage and is light.

However, the OLED display can easily deteriorate by responding to oxygen and moisture in the OLED display. Thus, dark spot and pixel shrinkage occur and yield is lowered.

To address such a problem, various types of sealing materials are being developed. The sealing materials include photo-curing, thermosetting resin composition, sealing technique by vapor deposition, etc., which can be found in various documents. However, such sealing materials are not good enough to protect the OLED element and secure stability and life, causing difficulties to manufacture the OLED element.

It is well known that the life of the OLED display can sharply increase if electrodes and organic layers in the OLED display are tightly sealed from the surrounding environment. However, several factors hinder the correct sealing of the OLED display. Some of those factors will be briefly described. First, a tight sealing should have a barrier to oxygen ($10^{-3}$ cc/m$^2$/day) and water ($10^{-6}$ g/m$^2$/day). The size of the tight sealing should be as minimum as possible (e.g., <2 mm) not to affect the size of the OLED display. Also, the temperatures generated during the sealing process should not damage materials (e.g., electrodes and organic layers) within the OLED display. For example, a first pixel of the OLED which is 1 to 2 mm far from the OLED display sealing should not be heated over 100° C. during the sealing process. Gas which is emitted during the sealing process should not contaminate materials within the OLED display. Moreover, an electric connector (e.g., thin film chromium) should be placed within the OLED display for the tight sealing.

A general method of sealing the OLED display is to use epoxide, inorganic and/or organic materials forming the sealing after being processed with UV.

Vitex System manufactures a coating agent named Barix™, which can be used to seal the OLED display with the inorganic and organic materials. Such a sealing method provides good physical intensity while it may not be cost effective since the process expense is very high. Also, diffusion of oxygen and moisture to the OLED display is not prevented. Another method of sealing the OLED display is to use metal welding and soldering. In this case, there is a substantial difference between CTEs of a glass plate and metal in the OLED display, thereby failing to provide durability at a wide range of temperatures. Thus, if the sealing method is used in a wider display, yield of the panel is lowered and errors increases due to a twist and cracks after the sealing process. Recently, a low melting point frit paste composition which can be used for the tight sealing by laser emission has been developed and used in sealing the OLED. However, if this paste composition applies to a dispensing process, it is hardly thin and processing time is extended, thereby adversely affecting productivity. If the paste composition applies to a screen printing, printing properties are ununiform and yield of the panel is lowered after the sealing process.

To perform a thin film process, one of strengths of the OLED, the thickness of the sealing material should be minimized. Thus, it is essential to apply a sealing material to as much thin film as possible by using the screen printing. However, a thin film process of about 10 μm is not possible for applying a paste to the dispensing process. In case of screen printing, errors occur during the sealing process due to ununiform patterns after printing and firing processes to thereby sharply decrease yield. To address such a problem, a composition including additives such as a dispersant, a leveling agent, an antifoaming agent, etc. has been developed. However, such additives contaminate the OLED during the sealing process, and act as impurities while a frit paste is densified. Thus, the additives are not appropriate as sealing materials sealing the OLED element.

Thus, there have been continuous demands for addressing the problems related to the typical sealing and sealing method for the OLED display.

SUMMARY OF THE INVENTION

Accordingly, it is an aspect of the present invention to provide a low melting point frit paste composition which is sealable by light emission, protects an element weak to heat, and a sealing method for an electric element using the same.

Also, it is another aspect of the present invention to provide a low melting point frit paste composition which is applicable to a screen printing, raises a process yield with good printing properties and is appropriate for a flat panel, and a sealing method for an electric element using the same.

Additional aspects and/or advantages of the present invention will be set forth in part in the description which follows and, in part, will be obvious from the description, or may be learned by practice of the present invention.

The foregoing and/or other aspects of the present invention are also achieved by providing a low melting point frit paste composition, comprising a) frit powder having $P_2O_5$ of 0.1 to 25 mol %, $V_2O_5$ of 0.1 to 50 mol %, ZnO of 0.1 to 20 mol %, BaO of 0.1 to 15 mol %, $Sb_2O_3$ of 0.1 to 10 mol %, $Fe_2O_3$ of 0.1 to 15 mol %, $Al_2O_3$ of 0.1 to 5 mol %, $B_2O_3$ of 0.1 to 5 mol %, $Bi_2O_3$ of 0.1 to 10 mol % and $TiO_2$ of 0.1 to 5 mol %; b) a filler; c) an organic binder which has a number average molecular weight of 50,000 to 100,000 g/mole and a viscosity of 500 to 2,000 cp if being dissolved in 5 wt % by butylcarbitolacetate; and d) an organic solvent.

The foregoing and/or other aspects of the present invention are also achieved by providing a sealing method for an electric element which is sealed by at least two materials, the sealing method comprising printing a low melting point frit paste composition according to one of claims 1 to 7 on a predetermined position of a material to be sealed and sealing the material by melting the low melting point frit paste composition printed by laser.

The foregoing and/or other aspects of the present invention are also achieved by providing an electric element which is tightly sealed by the sealing method.

BRIEF DESCRIPTION OF THE DRAWINGS

The above and/or other aspects of the present invention will become apparent and more readily appreciated from the following description of the embodiments, taken in conjunction with the accompanying drawings of which.

DETAILED DESCRIPTION OF EXEMPLARY EMBODIMENT

Figure 1:
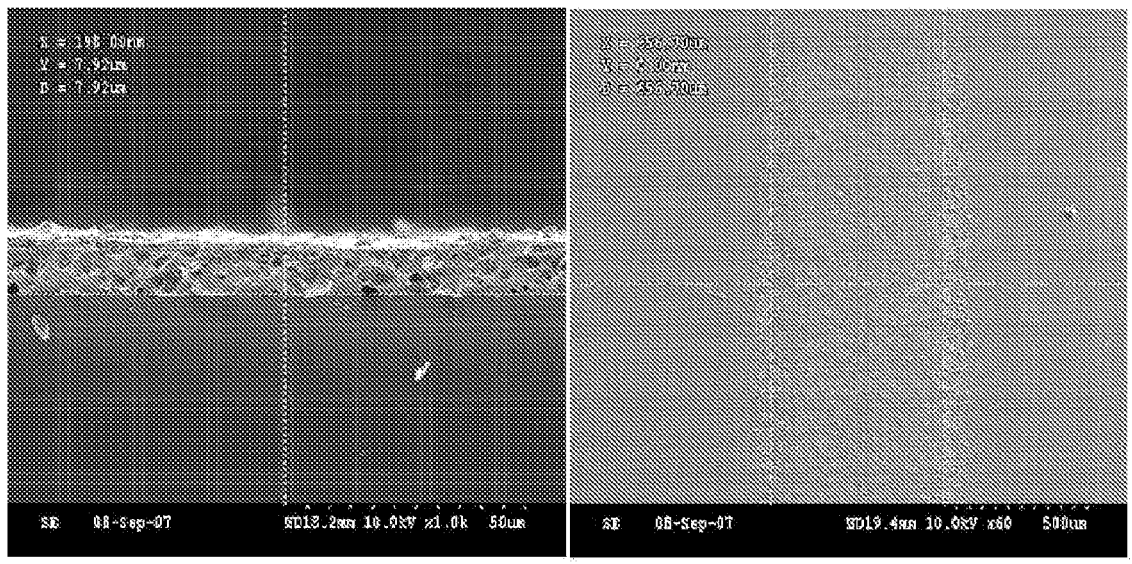
FIGS. 1, 3, 5 and 7 illustrate a transverse side of FE-SEM after screen printing, drying and firing frit paste manufactured according to an exemplary embodiment of the present invention.
Figure 2:
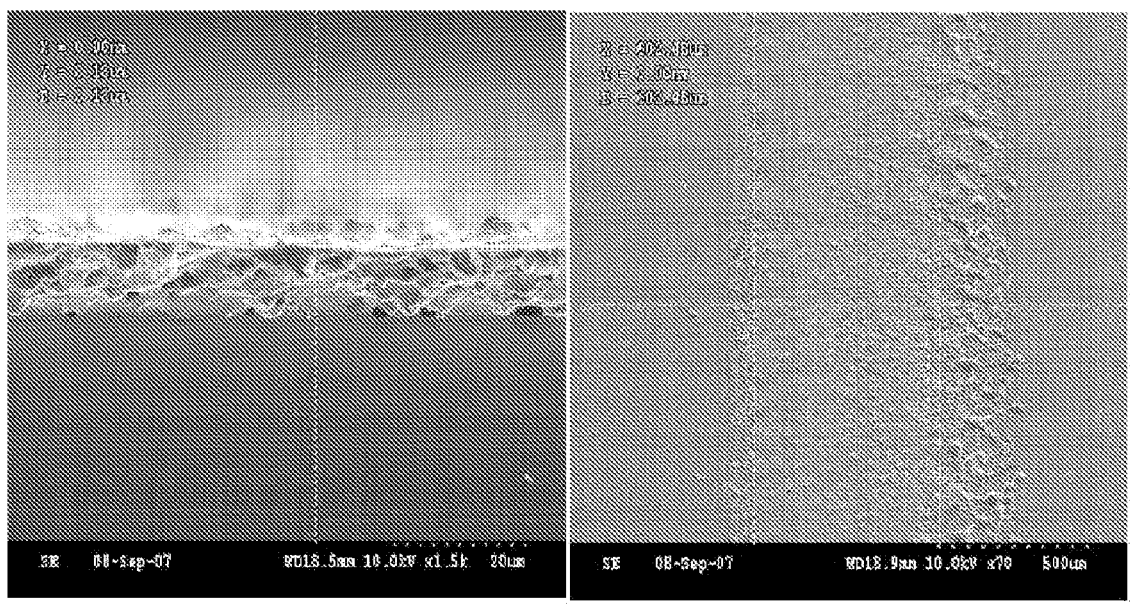
FIGS. 2, 4, 6 and 8 illustrate a vertical side of FE-SEM after screen printing, drying and firing frit paste manufactured according to an exemplary embodiment of the present invention.
Figure 3:
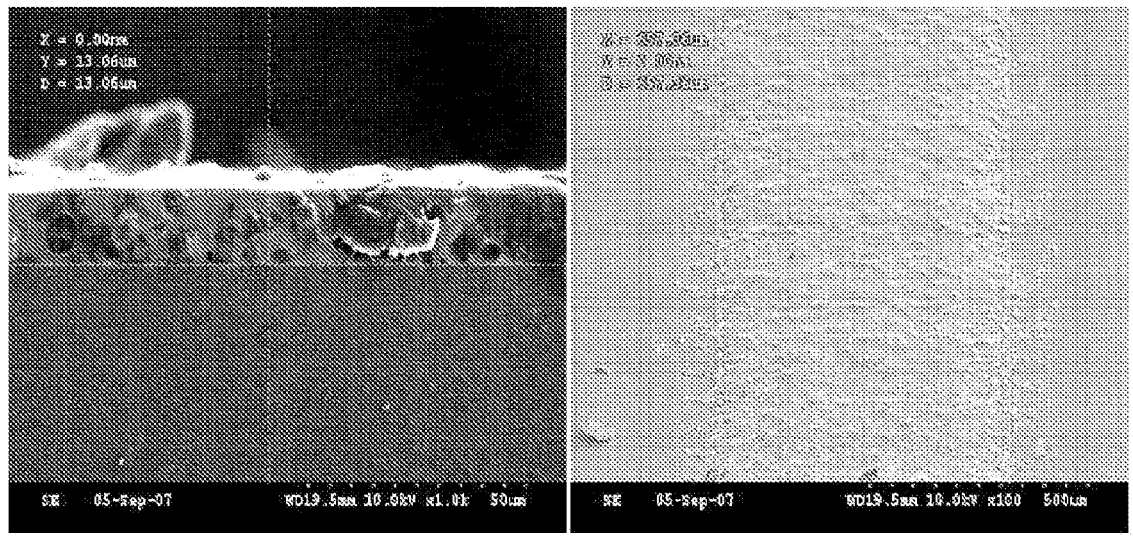
Figure 4:
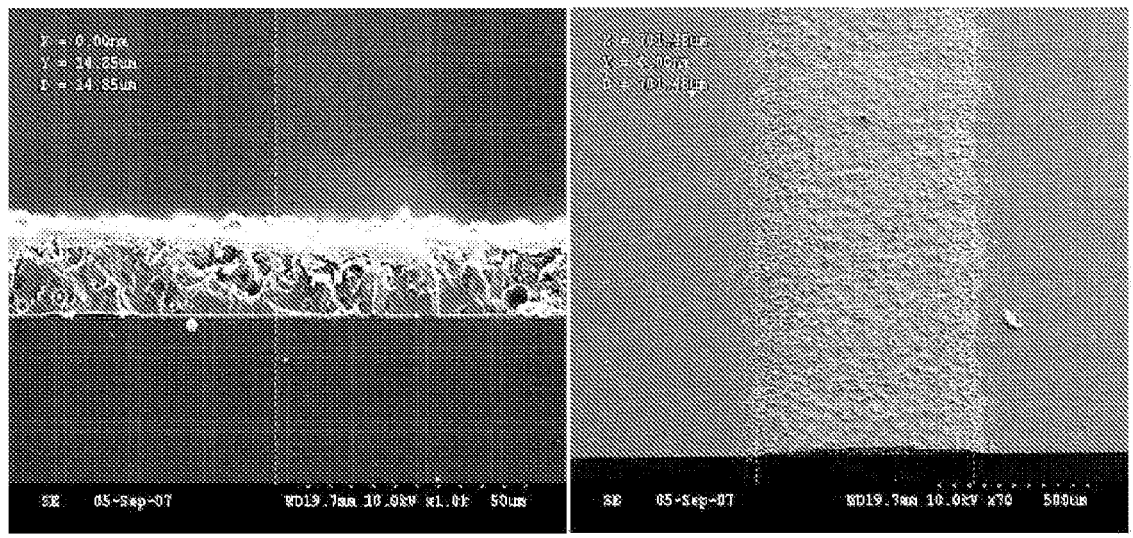
Figure 5:
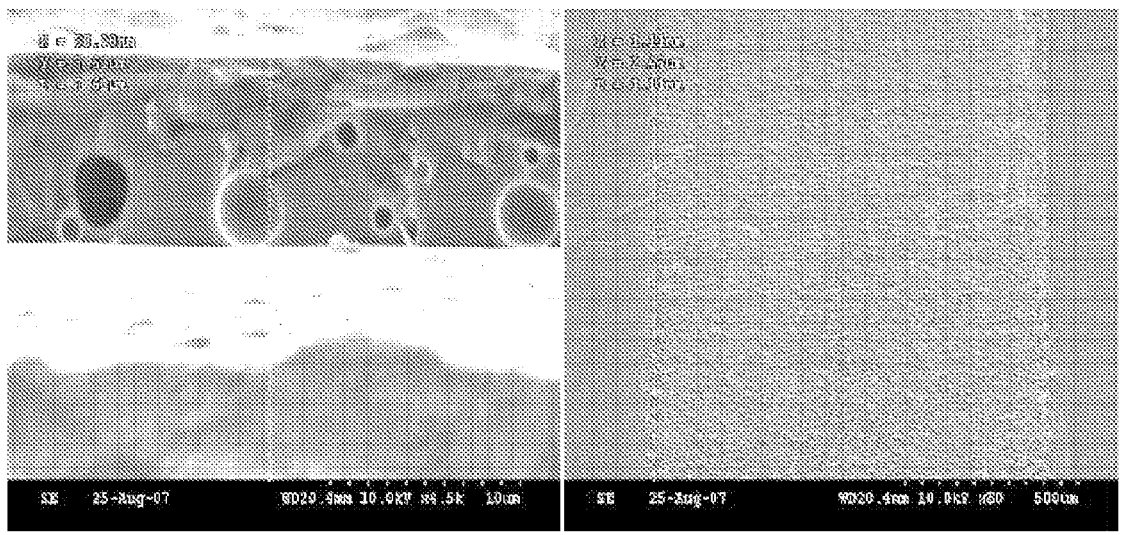
Figure 6:
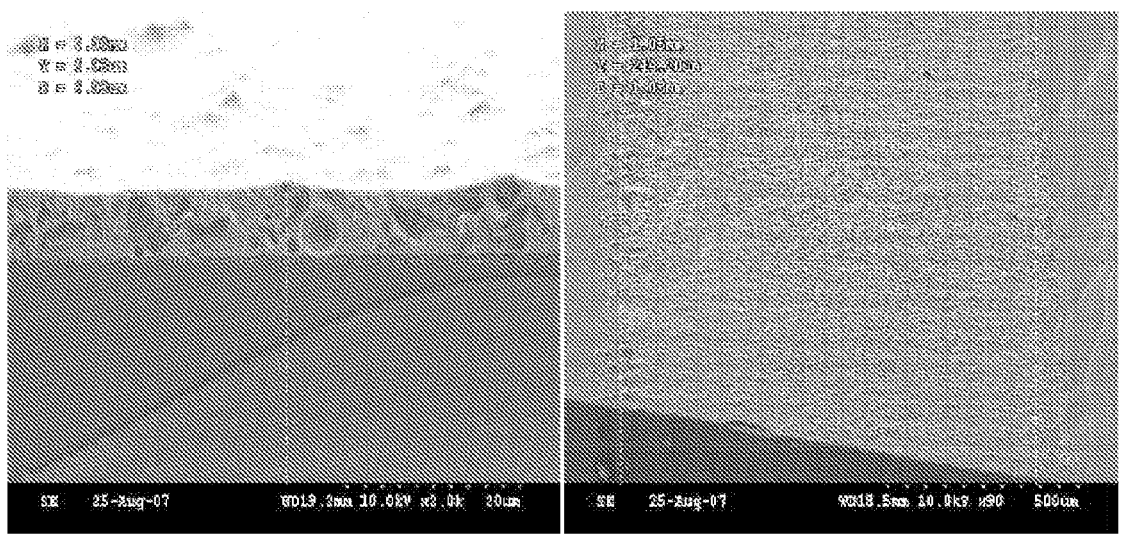
Figure 7:
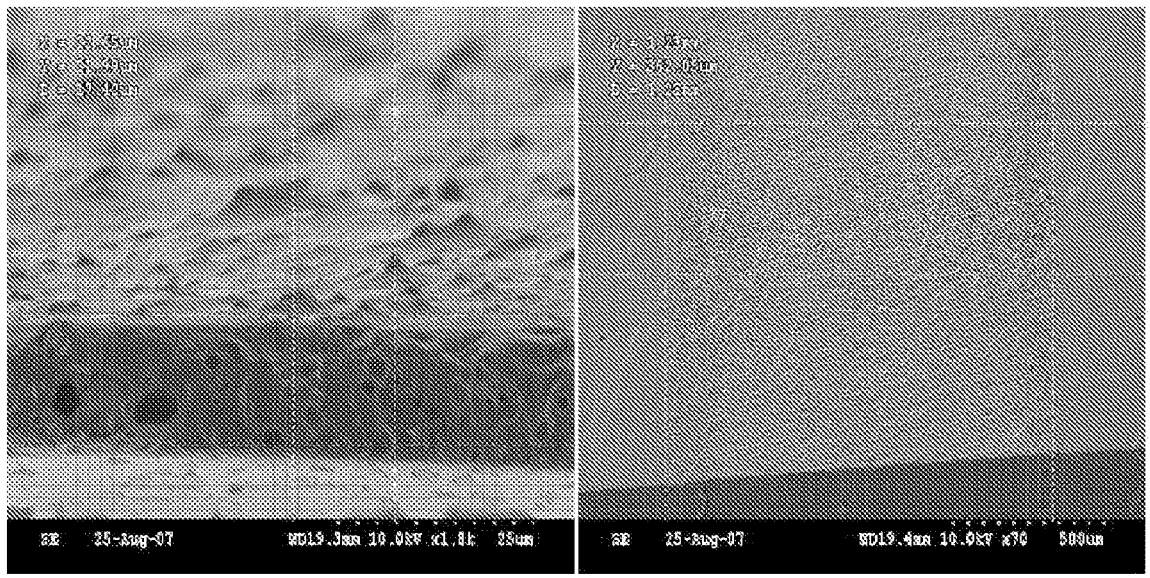
Figure 8:
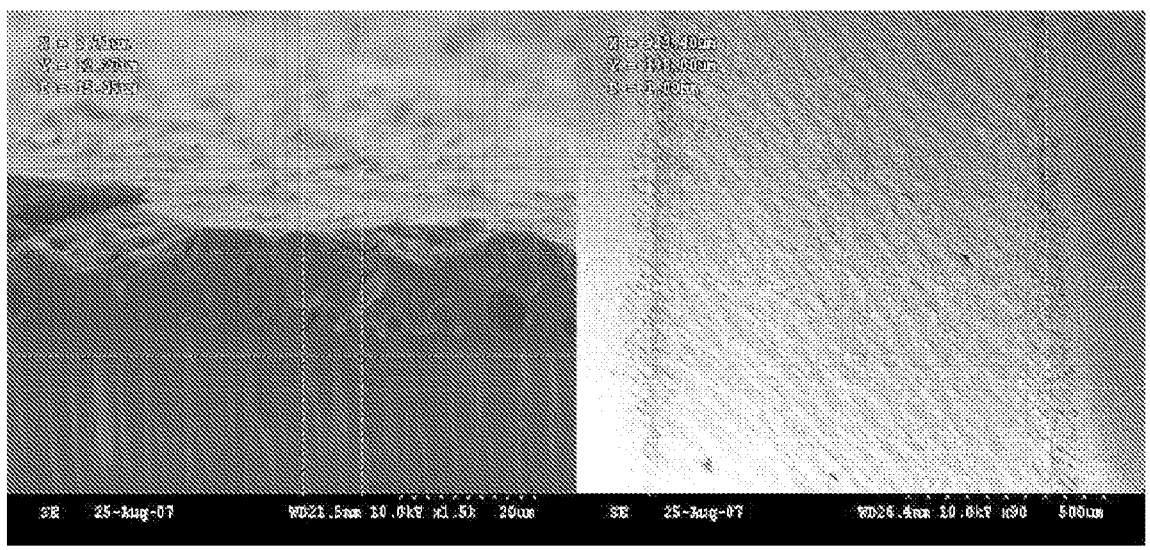

Hereinafter, exemplary embodiments of the present invention will be described with reference to accompanying drawings, wherein like numerals refer to like elements and repetitive descriptions will be avoided as necessary.

Hereinafter, the present invention will be described in detail.

A frit paste composition according to the present invention includes a low melting point frit powder composition which is densified at a temperature of 400° C. and below. The frit paste composition preferably includes frit powder having $P_2O_5$ of 0.1 to 25 mol %, $V_2O_5$ of 0.1 to 50 mol %, ZnO of 0.1 to 20 mol %, BaO of 0.1 to 15 mol %, $Sb_2O_3$ of 0.1 to 10 mol %, $Fe_2O_3$ of 0.1 to 15 mol %, $Al_2O_3$ of 0.1 to 5 mol %, $B_2O_3$ of 0.1 to 5 mol %, $Bi_2O_3$ of 0.1 to 10 mol % and $TiO_2$ of 0.1 to 5 mol %; a filler; an organic binder having a number average molecular weight of 50,000 to 100,000 g/mole and a viscosity of 500 to 2,000 cps if being melted in 5 wt % by butylcarbitolacetate (BCA); and an organic solvent.

The frit powder of the low melting point frit paste composition according to the present invention facilitates densification of the composition during a firing process and enables an effective sealing. Thus, the frit powder is included in the frit paste composition according to the present invention, as a main component.

The frit powder preferably includes $P_2O_5$ of 0.1 to 25 mol %, $V_2O_5$ of 0.1 to 50 mol %, ZnO of 0.1 to 20 mol %, BaO of 0.1 to 15 mol %, $Sb_2O_3$ of 0.1 to 10 mol %, $Fe_2O_3$ of 0.1 to 15 mol %, $Al_2O_3$ of 0.1 to 5 mol %, $B_2O_3$ of 0.1 to 5 mol %, $Bi_2O_3$ of 0.1 to 10 mol % and $TiO_2$ of 0.1 to 5 mol %.

More preferably, the frit powder includes $P_2O_5$ of 0.1 to 20 mol %, $V_2O_5$ of 20 to 47 mol %, ZnO of 0.1 to 15 mol %, BaO of 0.1 to 12.5 mol %, $Sb_2O_3$ of 0.1 to 9 mol %, $Fe_2O_3$ of 0.1 to 10 mol %, $Al_2O_3$ of 0.1 to 3 mol %, $B_2O_3$ of 0.1 to 3 mol %, $Bi_2O_3$ of 0.1 to 9 mol % and $TiO_2$ of 0.1 to 1 mol %.

If the content of the frit powder components is out of the range, vitrification may not occur after the firing process. Further, as a viscosity of the frit powder is low, it may not be applicable to a screen printing process and may not become paste.

The frit powder having the foregoing components preferably has a glass transition temperature (Tg) of 300 to 400° C. and a softening temperature of 300 to 400° C. If the glass transition temperature and softening temperature are within the range, the frit powder has good firing stability at low temperatures.

Preferably, the size of particles in the frit powder is 0.1 to 20 μm. If the size of the particles is within the range, low processing is available, and the frit powder is appropriate for tightly sealing an element weak to heat. As a laser processing is available, a sealing effect of the electric element may improve.

Preferably, the frit powder of 40 to 90 wt % is included in the composition. If the content of the frit powder is less than 40 wt %, vitrification is not available after a firing process and the frit powder may not be applicable to a screen printing process. If the content of the frit powder exceeds 90 wt %, it does not become a paste.

The b) filler of the low melting point frit paste composition according to the present invention prevents a twist or partial crack of a panel during a sealing process and protects a metal electrode in the panel. The filler adjusts a thermal expansion coefficient during a firing process of the composition to improve adhesion between a substrate of a panel and the composition, prevents twist and partial cracks and protects the metal electrode, depending on the content.

The filler may include at least one of cordierite, zircon, aluminum titanate, aluminum oxide, mullite, silica (crystal, α-quartz, glass, cristobalite, trydimite, etc.), tin oxide ceramic, β-spodumene, zirconium phosphate ceramic, β-quartz solid solution, etc. Preferably, the filler includes cordierite.

Preferably, the filler of 1 to 30 wt % is included in the composition. If the content of the filler is less than 1 wt % or more than 30 wt %, the substrate may be twisted or partly cracked after the sealing or the metal electrode in the panel may corrode due to different thermal expansion coefficients of a glass substrate.

The c) organic binder of the low melting point frit paste composition according to the present invention should be dispersed while maintaining continuous stability of frit powder included in the paste if the paste is stored at room temperature, and provide good patterning properties to the paste composition by a screen printing. The organic binder should be decomposed and eliminated at lower temperature than the frit powder-densifying temperature during a firing process to thereby minimize impurities during a sealing process, prevent contamination of an OLED after the sealing process and secure stability of the OLED.

Preferably, the organic binder has a number average molecular weight of 50,000 to 100,000 g/mole, and more preferably, 70,000 to 90,000 g/mole. If the number average molecular weight is less than 50,000 g/mole, compatibility between the organic binder and the frit powder is not sufficient for a screen printing to thereby lower printing properties. If the number average molecular weight exceeds 100,000 g/mole, flow of the paste is lowered and tailing occurs during a screen printing. In this case, uniform pattern may hardly be formed.

Preferably, the organic binder has a viscosity of 500 to 2,000 cp if being melted in 5 wt % by butylcarbitolacetate (BCA). If the viscosity is less than 500 cp, the thickness is less uniform and the organic binder may run down. If the viscosity exceeds 2,000 cp, print properties may be lowered and remain after a firing process.

The organic binder may include at least one of ethyl cellulose, ethylene glycol, propylene glycol, ethylhydroxyethylcellulose, phenolic resin, a mixture of ethyl cellulose and phenolic resin, ester polymer, methacrylate polymer, methacrylate polymer of low alcohol, monobutylether of ethylene glycol monoacetate. Particularly, the organic binder preferably includes ethyl cellulose (STD series, Dow Chemical).

Preferably, the organic binder is 0.1 to 5 wt % to the composition. If the content of the organic binder is less than 0.1 wt %, stability of frit powder included in the paste composition is hardly maintained and good patterning properties are not provided. If the content exceeds 5 wt %, impurities are caused during a sealing process and an OLED may be contaminated.

The d) organic solvent of the low melting point frit paste composition according to the present invention preferably has a high boiling point of 150 to 250° C. The organic solvent should not generate a contaminant of a panel during a sealing process by being vaporized at a lower temperature than a frit powder-densifying temperature during a firing process.

The organic solvent is compatible with the organic binder, and may include butyl carbitol acetate (BCA), α-terpineol (α-TPN) or dibutyl phthalate (DBP), ethyl acetate, β-terpineol, cyclohexanone, cyclopentanone, hexylene glycol, a mixture of high boiling point alcohol and alcohol ester, etc.

The organic solvent may vary depending on the type of the used organic binder. If the organic binder includes ethyl cellulose, the organic solvent may include a mixing solvent of butyl carbitol acetate (BCA), α-terpineol (α-TPN) and dibutyl phthalate (DBP).

Preferably, the organic solvent of 5 to 45 wt % may be included in the composition. If the content of the organic solvent is less than 5 wt %, viscosity is high and the organic solvent does not become paste. Also, a screen printing is not available. If the content exceeds 45 wt %, viscosity is lowered and the composition may not be applicable to a screen printing and may not have good print properties.

The low melting point frit paste composition according to the present invention having the foregoing components may further include an aqueous or dispersible additive. More specifically, the aqueous or dispersible additive may include e.g., a plasticizer, a release agent, a dispersant, a stripper, an antifoaming agent, a leveling agent, a wetting agent, etc. Preferably, a content of the additive is 0.1 to 10 wt %.

Preferably, the low melting point frit paste composition according to the present invention has a viscosity of 5,000 to 100,000 cps, and more preferably, 20,000 to 50,000 cps. If the viscosity of the paste composition is less than 5,000 cps, it is too low to have uniform print properties. Then, an organic binder having a light molecular weight should be used. As compatibility between the organic binder and the frit powder lacks, print properties are lowered. If the viscosity exceeds 100,000 cps, it is too high and causes tailing during a printing operation. As an organic binder having a heavy molecular weight should be used, the paste composition does not pass through a mask efficiently during a screen printing. Thus, it may be difficult to have uniform printing properties.

The present invention further provides a sealing method for an electric element using the low melting point frit paste composition. The sealing method for the electric element according to the present invention may apply typical processes of the sealing method for the electric element except that the low melting point frit paste composition is used.

More specifically, a sealing method for an OLED element as an example of the sealing method for the electric element according to the present invention may have following processes.

After an OLED lower member is prepared, OLED is deposited on a lower substrate according to a known method. After an OLED upper member is prepared, the low melting point frit paste composition is deposited on an upper substrate. The lower and upper members may include glass substrates, e.g., transparent glass members (Eagle 2000 manufactured by Samsung Corning Co., Ltd). Preferably, the low melting point frit paste composition is deposited on the upper member by a screen printing. The low melting point frit paste composition may be firmly attached to the upper substrate by free-sintering. After providing the upper substrate having the low melting point frit paste composition on the lower substrate having the OLED, laser is emitted to the low melting point frit paste to melt the low melting point frit paste. Then, the upper and lower substrates are connected to each other and tightly seal the OLED element.

More preferably, a photo-curable light transparent composition is applied across a surface of the lower substrate or the upper substrate having the low melting point frit paste composition and a getter composition, and then the upper and lower sealing members applied with the photo-curable light transparent composition are connected to each other. Then, light is emitted to the connected upper and lower sealing members to cure the photo-curable light transparent composition. Finally, laser is emitted to the low melting point frit paste composition and the getter composition to melt them and seal the lower and upper substrates. Then, the OLED element may be tightly sealed. The photo-curable light transparent composition may include aromatic epoxy resin, cyclic epoxy resin or epoxy resin as a mixture of the aromatic epoxy resin and cyclic epoxy resin of 100 wt %; a photo initiator of 0.01 to 20 wt %; and a coupling agent of 0.01 to 10 wt %. The photo-curable light transparent composition may have a light transmittance of 90 to 99% and a viscosity of 500 to 50,000 cps if being cured, and preferably further include a photo-acid generator of 0.05 to 10 wt % or an inorganic filler of 0.1 to 100 wt %. The getter composition may include the frit powder of 1 to 90 wt %; getter powder of 1 to 90 wt %; organic vehicle of 1 to 80 wt % and a solvent of 0 to 30 wt %. The getter powder may include zeolite, aluminum oxide, silica, alkali metal salt or alkaline earth metal oxide. The organic vehicle may include an organic solvent mixed with a binder such as ethyl cellulose of 1 to 10 wt %. The solvent may include an organic solvent. If the photo-curable light transparent composition and getter composition are used as described above, a light emitting layer and an electrode are protected by a curing solution of the photo-curable light transparent composition to thereby prevent errors due to contact of light emitters of the upper and lower sealing members. Also, workability of the display element sealing improves and moisture resistance and adhesion are excellent. Also, top emission is available and an aperture ratio of the display element improves. As light is emitted to the top, an area of the light emitting part may be extended without being disturbed by TFT, capacitor and wires. As light is not necessarily emitted to a lower electrode layer (anode), the substrates do not need to be transparent and can employ a thin substrate such as stainless steel.

The present invention further provides an electric element tightly sealed by the sealing method. More specifically, the electric element may include e.g., an OLED, a dye-sensitized solar cell, a seal of a display panel, an LED, a sensor or other optical devices. As a low melting point frit paste composition which is proper to lower temperature processing is used, negative impact to the element may be minimized and sealing effect to moisture and gas may sharply improve.

Hereinafter, exemplary embodiments of the present invention are provided to help understand the present invention. However, the present invention is not limited to following exemplary embodiments.

EXEMPLARY EMBODIMENTS

Exemplary embodiment 1

With composition as in Table 1, a frit paste according to exemplary embodiments 1 to 4 and comparative embodiments 1 to 3 was made. The unit in Table 1 is wt %. A filler which is used for the frit paste is cordierite, and the composition of frit powder is $P_2O_5$ of 19.58 mol %; $V_2O_5$ of 34.13 mol %; ZnO of 8.42 mol %; BaO of 10.57 mol %; $Sb_2O_3$ of 8.34 mol %; $Fe_2O_3$ of 9.20 mol %: $Al_2O_3$ of 0.70 mol %; $B_2O_3$ of 0.48 mol %; $Bi_2O_3$ of 8.02 mol %; and $TiO_2$ of 0.55 mol %.

Table 2 shows viscosity and molar weight of an organic binder used. The viscosity was measured by Brook field viscometer at 25° C. while the molecular weight was measured by waters 2695 GPC.

TABLE 1

| Item | | Exemplary embodiments | | | | Comparative Embodiments | | |
|---|---|---|---|---|---|---|---|---|
| | | 1 | 2 | 3 | 4 | 1 | 2 | 3 |
| Frit powder | | 55 | 54 | 53 | 53 | 55 | 55 | 55 |
| Filler | | 15 | 15 | 15 | 15 | 15 | 15 | 15 |
| Organic Binder | STD-10 | — | — | — | — | 2 | — | — |
| | STD-45 | — | — | — | — | — | 1 | 1 |
| | STD-200 | 2 | 2 | 2 | 2 | — | — | — |
| Organic solvent | | 28 | 28 | 26 | 26 | 28 | 29 | 29 |
| Leveling agent | BYK 335 | — | 1 | — | — | — | — | — |
| | BYK 358N | — | — | — | 4 | — | — | — |
| Dispersant | disper 1150 | — | — | 4 | — | — | — | — |

TABLE 2

| Item | STD 10 | STD 45 | STD 200 |
|---|---|---|---|
| Viscosity of organic binder (Cps.) | 58.0 | 252.7 | 890.6 |
| Molecular weight of organic binder (g/mol) | 24,106 | 43,256 | 81,653 |

Particle size, thickness of pattern, viscosity and laser sealing were examined by a following method with the frit paste according to the exemplary embodiments 1 to 4 and comparative embodiments 1 to 3. The result was shown in Table 3 below.

1. Particle size—analyzed by wet analysis by using Particle size analyzer to write a particle size of $D_{90}$.

2. Thickness of pattern—performed drying and firing processes after printing cell patterns having a width of 0.4 mm, 0.6 mm and 1 mm. An average thickness of patterns with respect to each width was measured by surface profiler (KLA Tencor P-16).

3. Viscosity—measured by Brook field viscometer at 25° C.

4. Laser sealing—Sealing test was conducted with laser after forming a sealing pattern through screen printing, drying and firing processes with respect to the frit paste according to the exemplary embodiments 1 to 4 and comparative embodiments 1 to 3. Intragra-MP laser of Spectra-physics was emitted to determine whether the frit paste was sealed. The frit paste was examined by naked eyes. If the sealing was performed, it was marked in O. If the sealing was not performed, it was marked in X.

TABLE 3

| Item | | Exemplary embodiments | | | | Comparative Embodiments | | |
|---|---|---|---|---|---|---|---|---|
| | | 1 | 2 | 3 | 4 | 1 | 2 | 33 |
| Particle size (D90) | | 10 | 10 | 10 | 10 | 10 | 10 | 10 |
| Thickness (μm) | 0.4 mm | 8.94 | 13.17 | 8.61 | 8.582 | 14.45 | 14.52 | 13.26 |
| | 0.6 mm | 8.91 | 13.21 | 8.777 | 9.783 | 15.74 | 12.76 | 15.74 |
| | 1 mm | 8.86 | 13.65 | 9.357 | 10.73 | 15.46 | 15.64 | 16.02 |
| Viscosity (cps.) | | 22673 | 20120 | 6727 | 5579 | 5572 | 12400 | 11862 |
| Laser sealing | | o | o | o | o | o | o | o |

After screen printing, drying and firing the frit paste according to the exemplary embodiments 1 to 4 and comparative embodiments 1 to 3, patterns were examined by FE-SEM (HITACHI, S-4300). FIGS. 1 to 14 are FE-SEM pictures.

FIGS. 1, 3, 5 and 7 are transverse FE-SEM pictures after the frit paste according to the exemplary embodiments 1 to 4 of the present invention were screen printed, dried and fired. FIGS. 2, 4, 6 and 8 are vertical FE-SEM pictures after the frit paste according to the exemplary embodiments 1 to 4 of the present invention were screen printed, dried and fired.

Figure 9:
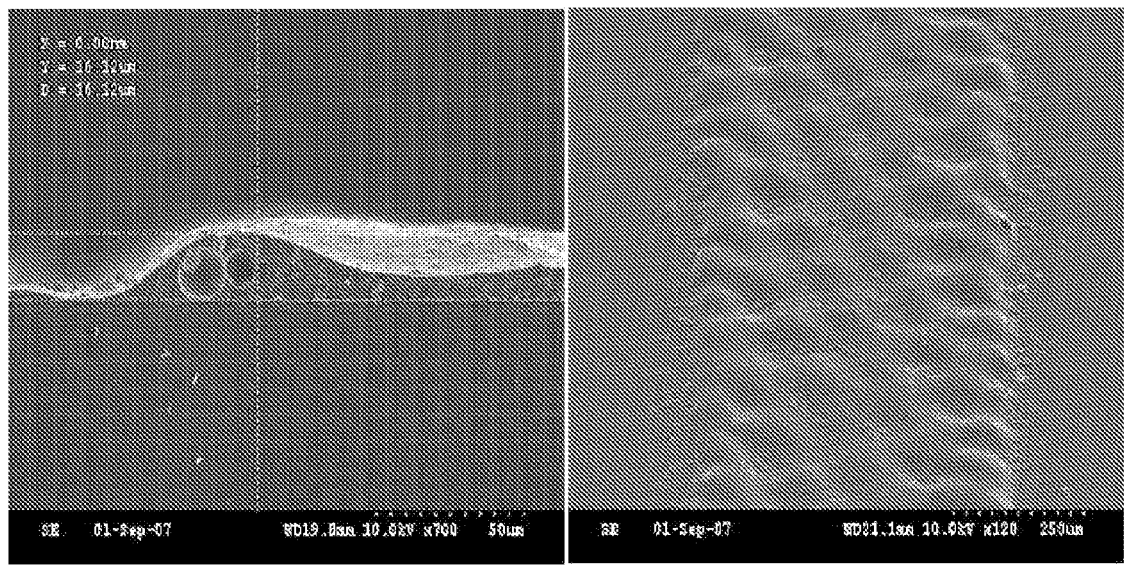
FIGS. 9, 11 and 13 illustrate a transverse side of FE-SEM after screen printing, drying and firing frit paste manufactured according to a comparative embodiment of the present invention.
Figure 10:
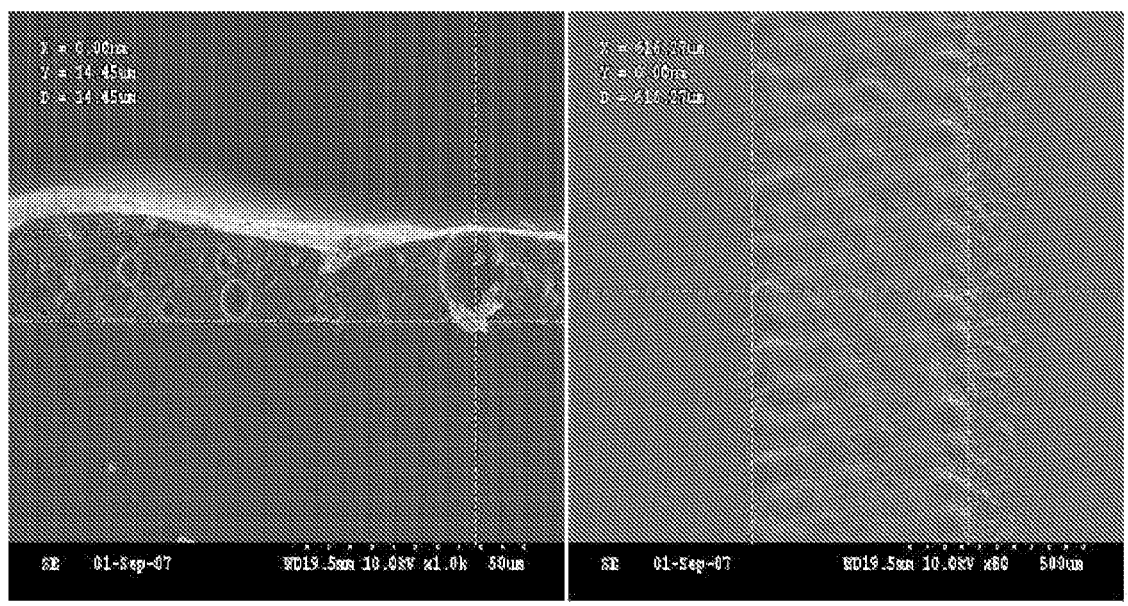
FIGS. 10, 12 and 14 illustrate a vertical side of FE-SEM after screen printing, drying and firing frit paste manufactured according to a comparative embodiment of the present invention.
Figure 11:
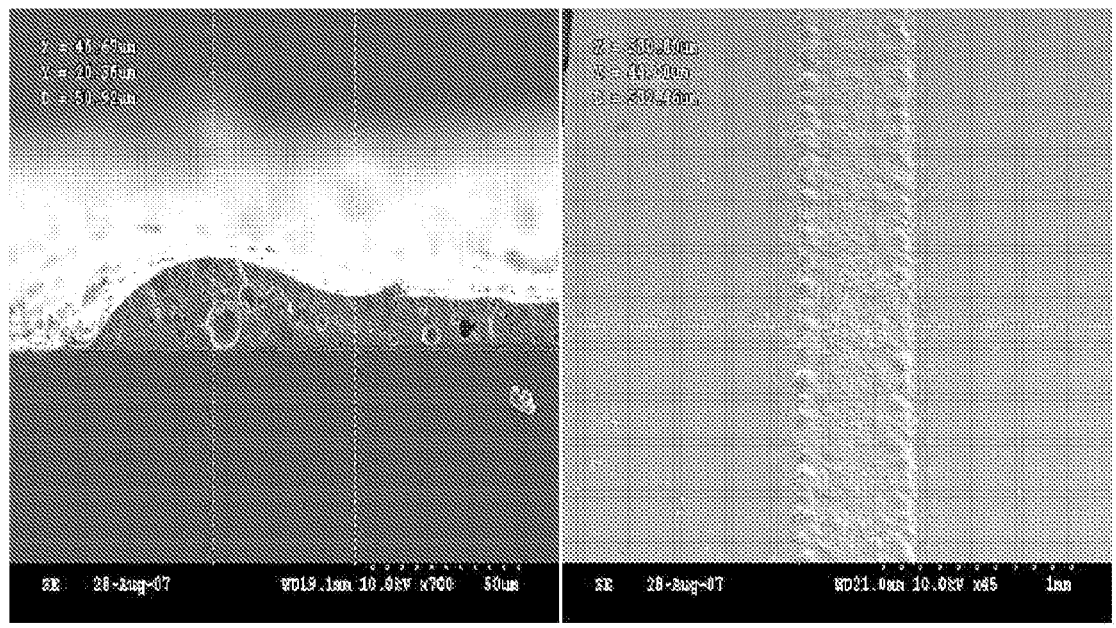
Figure 12:
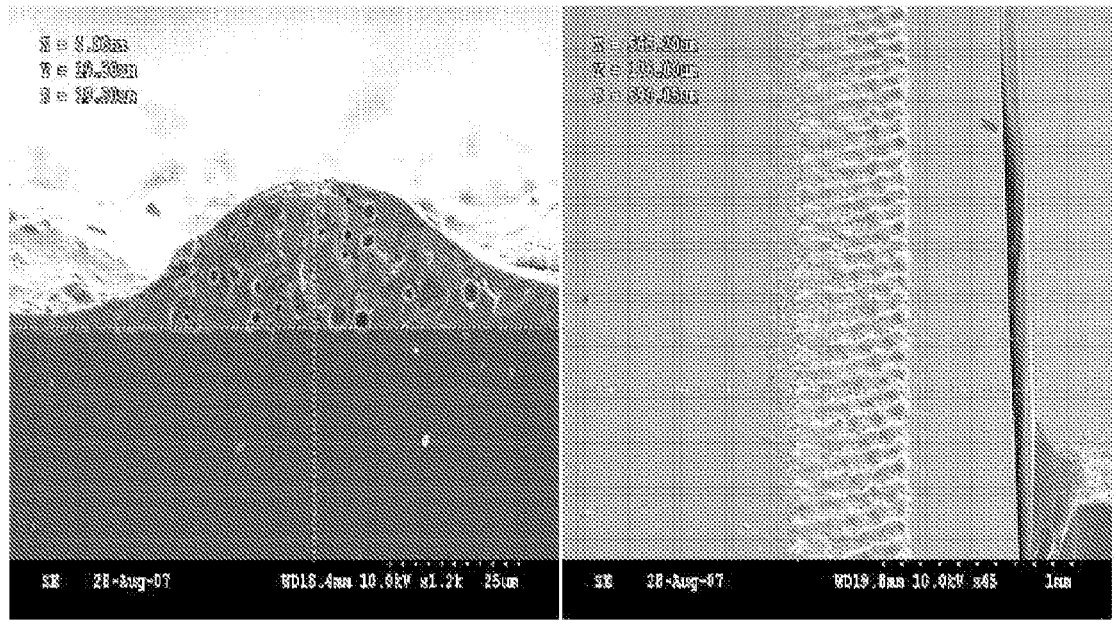
Figure 13:
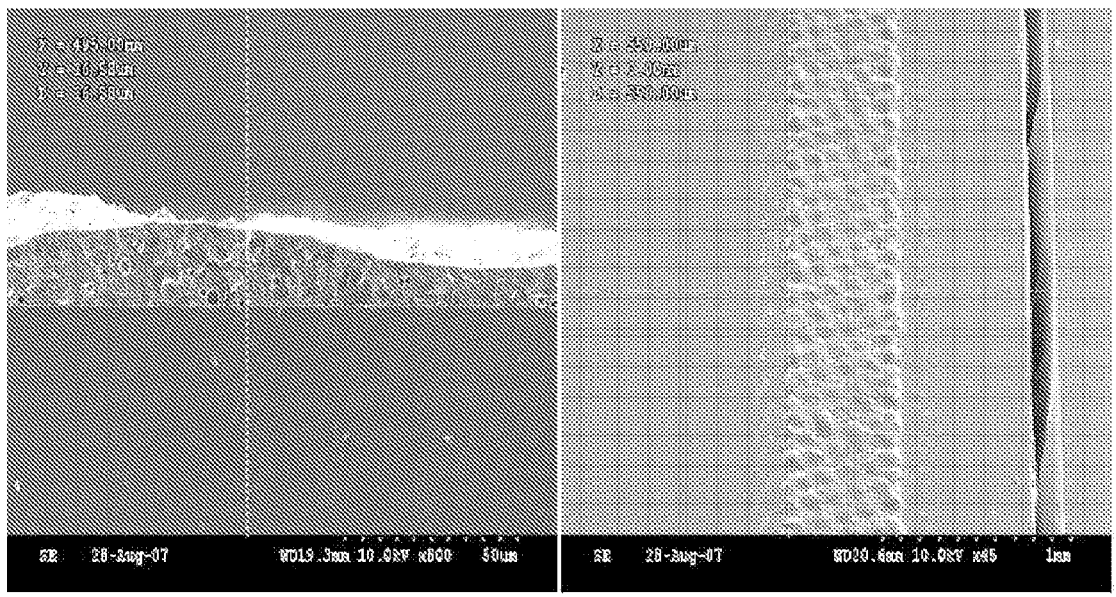
Figure 14:
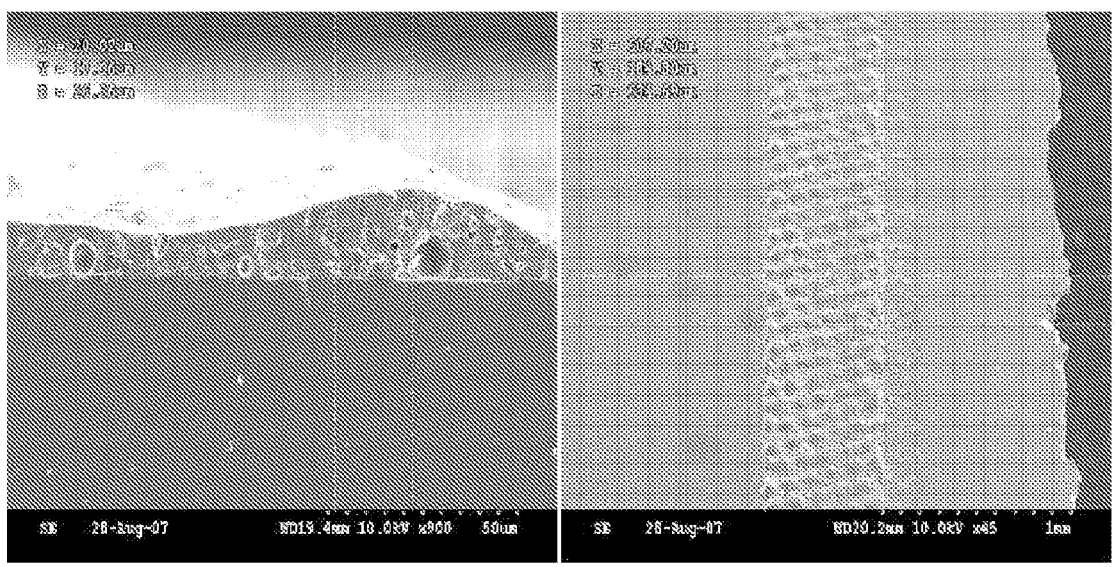

FIGS. 9, 11 and 13 are transverse FE-SEM pictures after the frit paste according to the comparative embodiments 1 to 3 of the present invention were screen printed, dried and fired. FIGS. 10, 12 and 14 are vertical FE-SEM pictures after the frit paste according to the comparative embodiments 1 to 3 of the present invention were screen printed, dried and fired.

As shown in Table 2 and FIGS. 1 to 14, the frit paste according to the exemplary embodiments 1 to 4 of the present invention formed uniform patterns and thickness after being printed, dried and fired. There was no mesh trace of the mask possibly generated during a printing operation. Meanwhile, the paste according to the comparative embodiments 1 to 3 had mesh trace and ununiform pattern after the printing process. According to the thickness measurement, the frit paste according to the exemplary embodiments 1 to 4 of the present invention provided a thin and uniform sealing pattern of 8 to 15 μm. That is, a flat panel can be manufactured.

A low melting point frit paste composition according to the present invention may be fired at low temperatures and thus manufacturing costs may be reduced. As an element is sealed by laser, the element does not receive thermal shock. Processing efficiency improves with a screen printing process to thereby reduce process costs. Also, a panel has a high yield with good print properties. As a composition may be printed in a thickness of 8 to 15 μm, the thickness of the panel is reduced and a flat panel may be manufactured.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A low melting point frit paste composition, comprising:
   a) frit powder having $P_2O_5$ of 0.1 to 25 mol %, $V_2O_5$ of 0.1 to 50 mol %, ZnO of 0.1 to 20 mol %, BaO of 0.1 to 15 mol %, $Sb_2O_3$ of 0.1 to 10 mol %, $Fe_2O_3$ of 0.1 to 15 mol %, $Al_2O_3$ of 0.1 to 5 mol %, $B_2O_3$ of 0.1 to 5 mol %, $Bi_2O_3$ of 0.1 to 10 mol % and $TiO_2$ of 0.1 to 5 mol%;
   b) a filler;
   c) an organic binder which has a number average molecular weight of 50,000 to 100,000 g/mole and a viscosity of 500 to 2,000 cp if being melted in 5 wt% by butylcarbitolacetate; and
   d) an organic solvent.

2. The low melting point frit paste composition according to claim 1, comprising:
   a) frit powder of 40 to 90 wt %;
   b) a filler of 1 to 30 wt %;
   c) an organic binder of 0.1 to 5 wt % having a number average molecular weight of 50,000 to 100,000 g/mole and a viscosity of 500 to 2,000 cp if being melted in 5 wt% by butylcarbitolacetate; and
   d) an organic solvent of 5 to 45 wt %.

3. The low melting point frit paste composition according to claim 1, wherein the a) frit powder has $P_2O_5$ of 0.1 to 20 mol %, $V_2O_5$ of 20 to 47 mol%, ZnO of 0.1 to 15 mol%, BaO of 0.1 to 12.5 mol %, $Sb_2O_3$ of 0.1 to 9 mol %, $Fe_2O_3$ of 0.1 to 10 mol %, $Al_2O_3$ of 0.1 to 3 mol%, $B_2O_3$ of 0.1 to 3 mol%, $Bi_2O_3$ of 0.1 to 9 mol % and $TiO_2$ of 0.1 to 1 mol %.

4. The low melting point frit paste composition according to claim 1, wherein the filler comprises cordierite.

5. The low melting point frit paste composition according to claim 1, wherein the organic binder comprises at least one selected from ethyl cellulose, ethylene glycol, propylene glycol, ethylhydroxyethylcellulose, phenolic resin, a mixture of ethyl cellulose and phenolic resin, ester polymer, methacrylate polymer, methacrylate polymer of low alcohol and monobutylether of ethylene glycol monoacetate.

6. The low melting point frit paste composition according to claim 1, wherein the organic solvent comprises at least one selected from butyl carbitol acetate (BCA), α-terpineol (α-TPN), dibutyl phthalate (DBP), ethyl acetate, β-terpineol, cyclohexanone, cyclopentanon, hexylene glycol and a mixture of high boiling point alcohol and alcohol ester.

7. The low melting point frit paste composition according to claim 1, wherein a viscosity of the paste composition ranges from 5,000 to 100,000 cps.

8. A sealing method for an electric element which is sealed by at least two materials, the sealing method comprising:
   printing a low melting point frit paste composition according to claim 1 on a predetermined position of a material to be sealed and sealing the material by melting the low melting point frit paste composition printed by laser.

9. The sealing method according to claim 8, wherein the electric element comprises an OLED element, further comprising:
   applying a photo-curable light transparent composition to a surface of a lower substrate or an upper substrate printed with a low melting point frit paste composition and a getter composition connected to each other when tightly sealed;
   curing the photo-curable light transparent composition by emitting light to the connected upper and lower sealing members after connecting the upper and lower sealing members having the photo-curable light transparent composition; and
   melting the glass frit paste composition and getter composition by laser to seal upper and lower substrates.

10. An electric element which is tightly sealed by a sealing method according to claim 8.

11. The electric element according to claim 10, wherein the electric element comprises an OLED element, a dye-sensitized solar cell (DSSC), a seal of a display panel, a light emitting diode (LED), a sensor or an optical device.

* * * * *